United States Patent [19]

Ishido et al.

[11] Patent Number: 5,464,725
[45] Date of Patent: Nov. 7, 1995

[54] METHOD OF MANUFACTURING A PRINTED WIRING BOARD

[75] Inventors: Kiminori Ishido; Masahiro Yamaguchi, both of Tokyo, Japan

[73] Assignee: NEC Corporation, Japan

[21] Appl. No.: 959,752

[22] Filed: Oct. 13, 1992

[30] Foreign Application Priority Data

Oct. 31, 1991 [JP] Japan .................................. 3-285333

[51] Int. Cl.[6] .................................................. G03C 5/00
[52] U.S. Cl. ........................ 430/311; 430/313; 430/314
[58] Field of Search .................................. 430/311, 313, 430/314

[56] References Cited

U.S. PATENT DOCUMENTS 4,706,167  11/1987  Sullivan ..................................... 427/96
4,830,704   5/1989  Voss et al. ............................... 430/318

Primary Examiner—John Kight, III
Assistant Examiner—T. Mosley
Attorney, Agent, or Firm—Laff, Whitesel, Conte & Saret

[57] ABSTRACT

After pads 2 for mounting parts are formed at desired positions on an insulating board 1 in a circuit forming process using etching resist 3, the etching resist 3 is left on the pads without peeling it off. A first photosolder resist 4 is then formed between the pads 2, exposed to light, and developing using a solvent able to separate the etching resist 3 as a developing liquid, following which the etching resist 3 is peeled off together with the not yet fully hardened first photosolder resist 4. After formation of the first photosolder resist 4, a second photosolder resist is formed on desired areas excluding the interspaces between the pads 2, exposed to light, and developed. Consequently, when a photosolder resist is formed between pads pitched at narrow intervals on a printed wiring board, attachment of the photosolder resist to the pads due to misalignment between the insulating board and a photo-mask can be avoided.

4 Claims, 6 Drawing Sheets

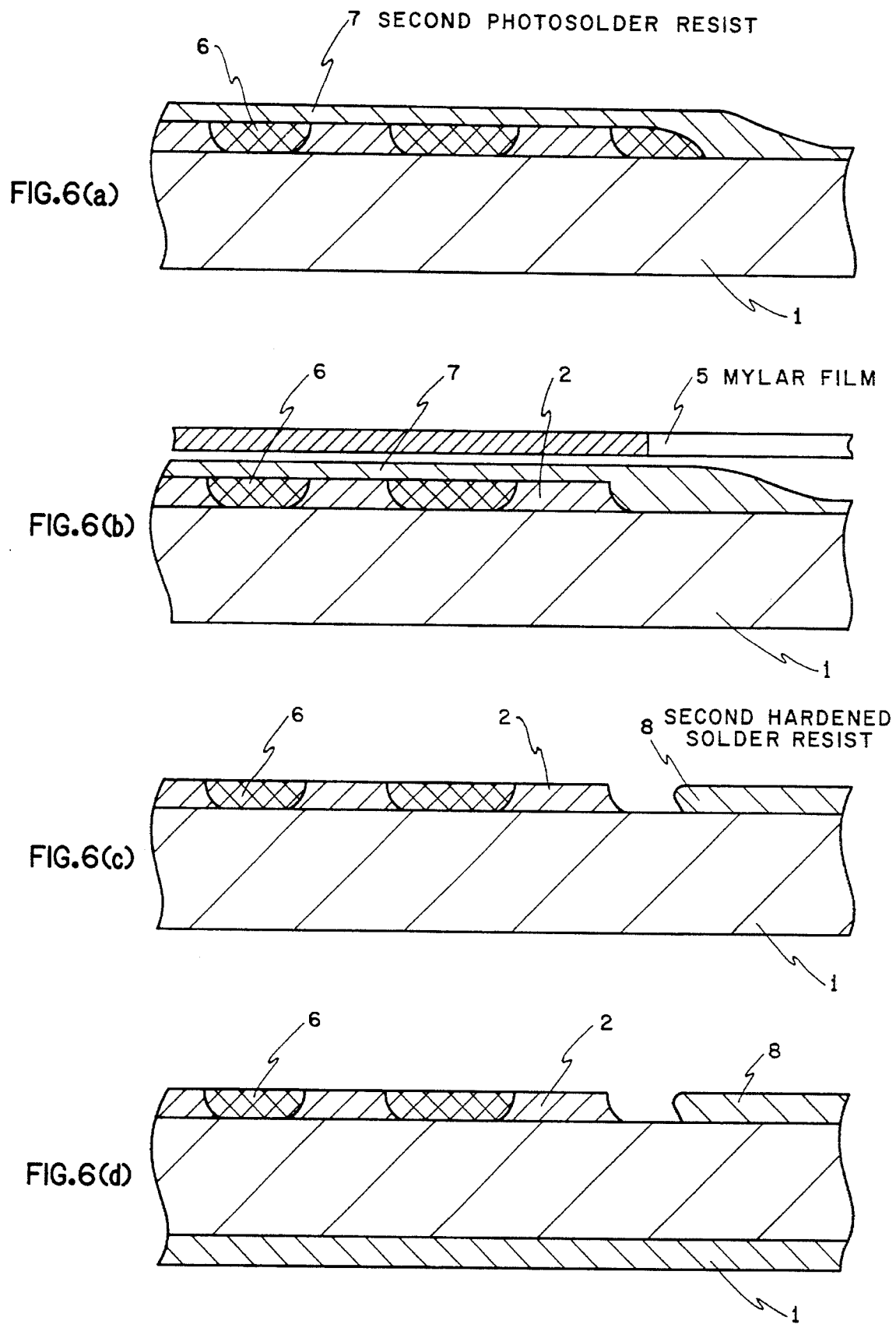

5,464,725

METHOD OF MANUFACTURING A PRINTED WIRING BOARD

BACKGROUND OF THE INVENTION

1. Field of the Invention

The present invention relates to a method of manufacturing a printed wiring board and more particularly to a method of manufacturing a printed wiring board having pads pitched at narrow intervals for mounting parts.

2. Description of the Related Art

Conventionally, according to the solder resist processes of the type of printed wiring board shown in FIGS. 1 (a)–(d) and FIGS. 2 (a) and (b), after pads 2 for mounting parts are formed at desired positions in a circuit on an insulating board 1 by a forming process using etching resist 3 (FIG. 1 (a)), the etching resist 3 is peeled off (FIG. 1 (b)).

One side of the insulating board is then coated with photosolder resist 9 (FIG. 1(c)). The photosolder resist 9 is then dried to a tack-free state and subjected to a process in which the resist 9 is exposed to ultraviolet rays through a Mylar film serving as a photo mask (FIG. 1(d)) and then to a developing process to prepare a hardened solder resist 10 (FIG. 2 (a)).

Thereafter, the processes illustrated in FIG. 1 (c), 1 (d) and FIG. 2 (a) are repeatedly applied to the other side of the insulating board 1 to form a desired pattern of solder resist 9a (FIG. 2 (b)).

For the solder resist, a photosolder resist composed of a liquid crystal or a dry film and a thermosetting liquid solder resist are generally used.

SUMMARY OF THE INVENTION

The method of the prior art for manufacturing a printed wiring board having pads of narrow pitch for mounting parts has the several drawbacks. In general, a solder resist is formed between pads for mounting parts of a printed wiring board in order to prevent the formation of solder bridges or soldered balls when the parts are packaged. However, as the density of the printed wiring board increases, the spacing between the pads gradually becomes smaller, and even with photosolder resist, it is difficult to form a solder resist between the pads because there is a limit to the accuracy in aligning an insulating board with a Mylar film at the time of exposure, and misalignment can result in solder resist being attached to the pads. Although an effective pad width is specified as a standard in order to retain contact reliability between pads and parts, the standard is in cases not met due to the attachment of the solder resist to the pads.

Accordingly, it is an object of the present invention to solve such problems and provide a method for manufacturing a printed wiring board that ensures contact reliability between parts and the pads for mounting the parts.

According to the present invention, the method of manufacturing a printed wiring board includes the processes of:

forming pads for mounting parts on an insulating board for a circuit-forming process using etching resist such that said etching resist remains on the pad without peeling it off, applying a first photosolder resist onto particular areas including at least the interspaces between the pads formed on said insulating board, exposing the interspaces between the pads to light, and peeling off said etching resist together with the first photosolder resist which, although having been subjected to the developing process and exposure to light, has not yet completely hardened.

The above and other objects, features and advantages of the present invention will become apparent from the following description with reference to the accompanying drawings which illustrate an example of a preferred embodiment of the present invention.

BRIEF DESCRIPTION OF THE DRAWINGS

FIGS. 6 (a)–(d) illustrate processes following the processes of FIG. 5.

DETAILED DESCRIPTION OF THE PREFERRED EMBODIMENTS

Figure 1A:
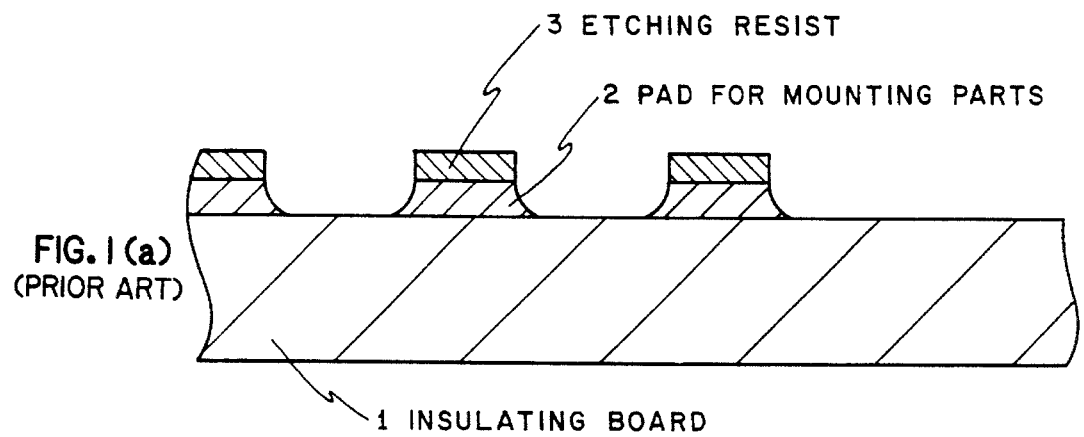
FIG. 1 is a longitudinal cross-sectional view illustrating a conventional method of manufacturing a printed wiring board, with (a)–(d) illustrating each process of the method.
Figure 1B:
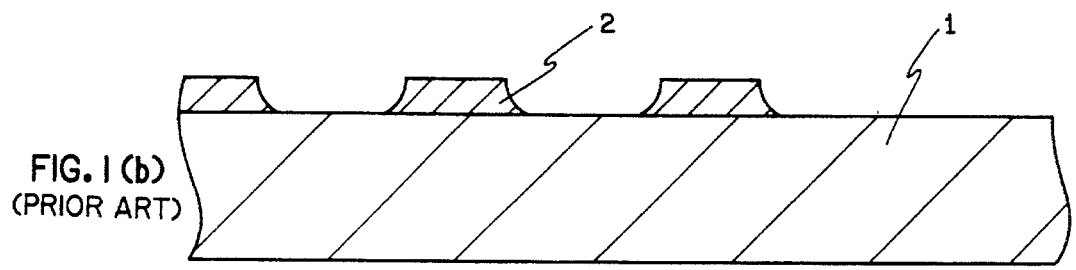
Figure 1C:
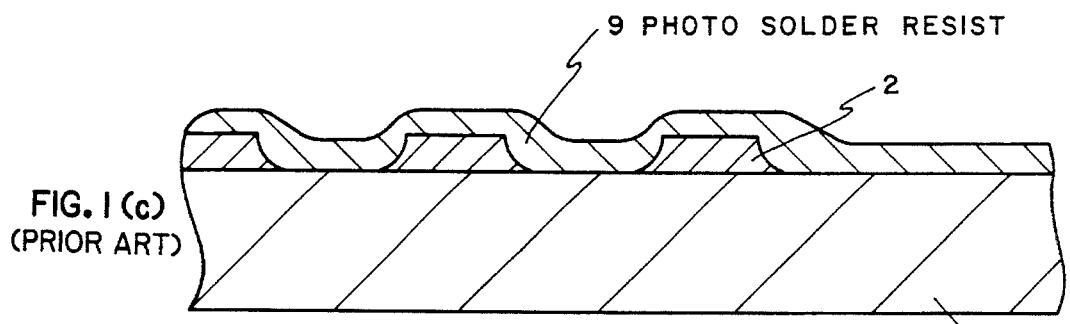
Figure 1D:
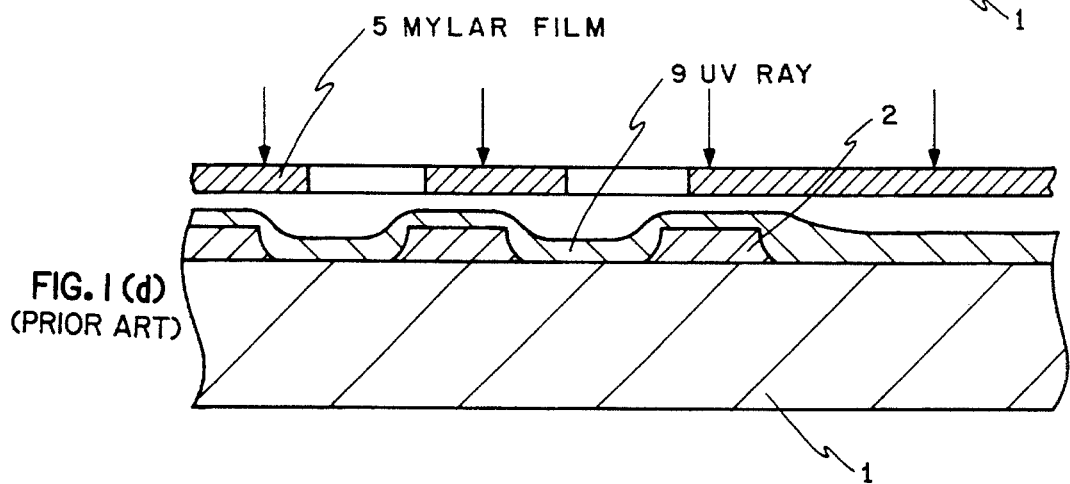
Figure 2A:
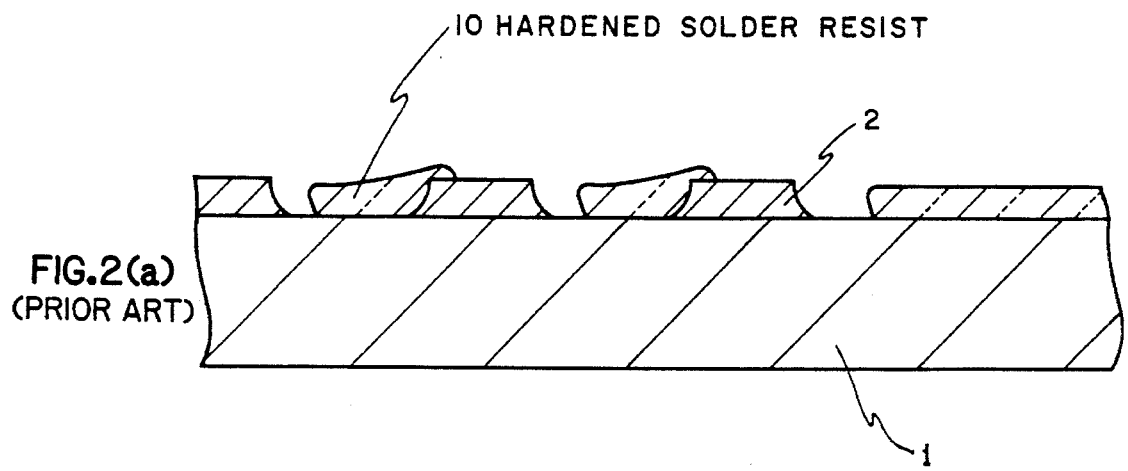
FIGS. 2 (a) and (b) illustrate processes following the processes of FIG. 1.
Figure 2B:
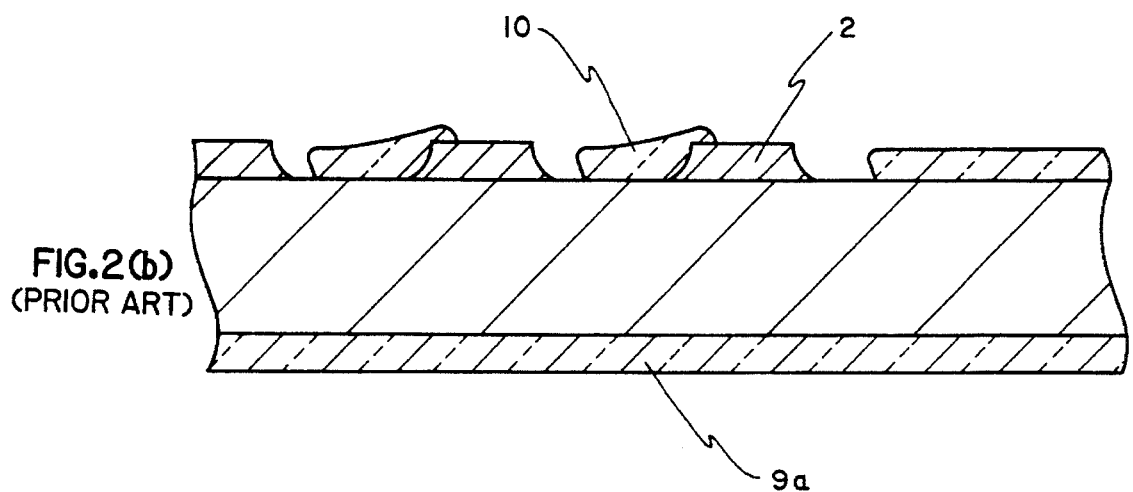
Figure 3A:
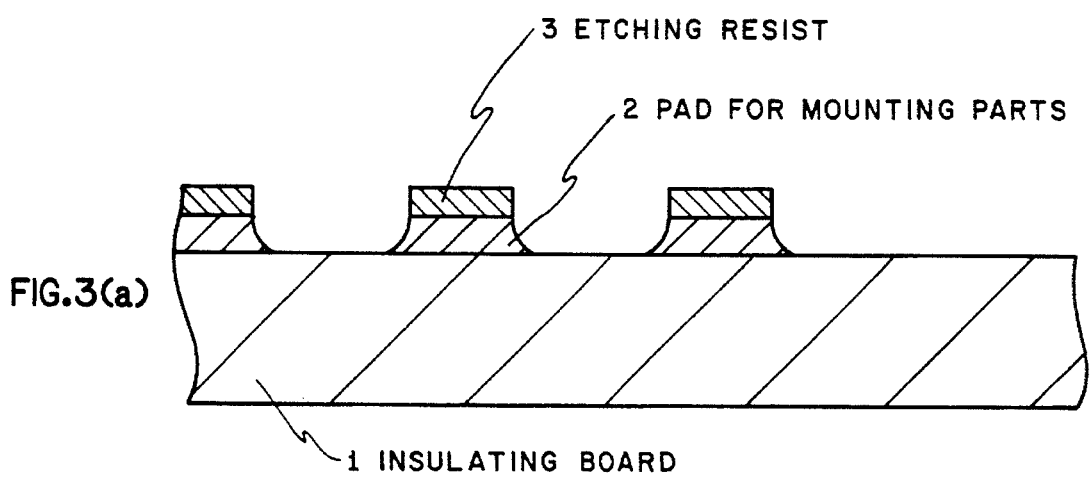
FIG. 3 is a longitudinal cross-sectional view illustrating a method of manufacturing the printed wiring board according to a first embodiment of the present invention.
Figure 3B:
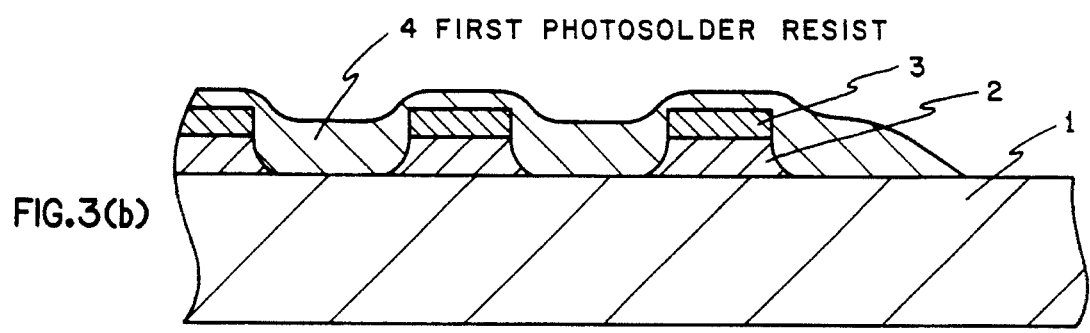
Figure 3C:
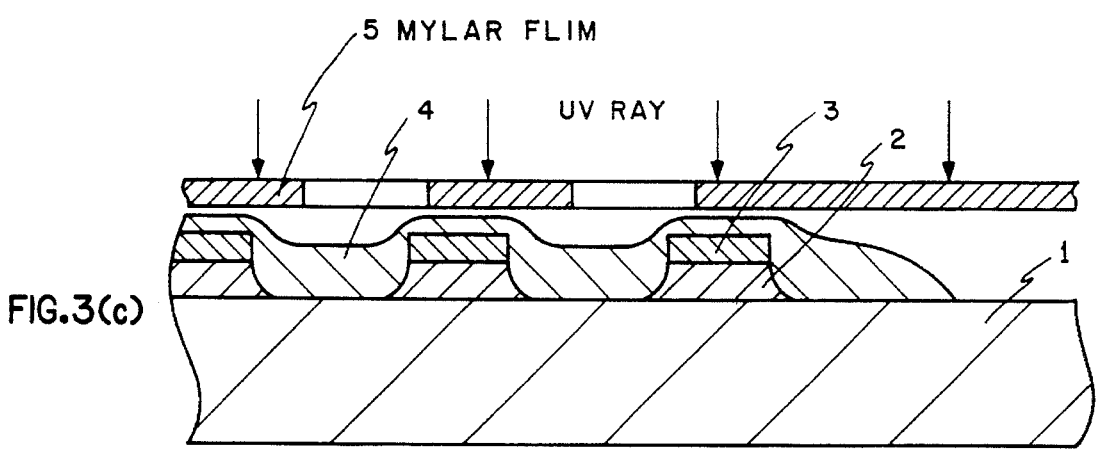
Figure 3D:
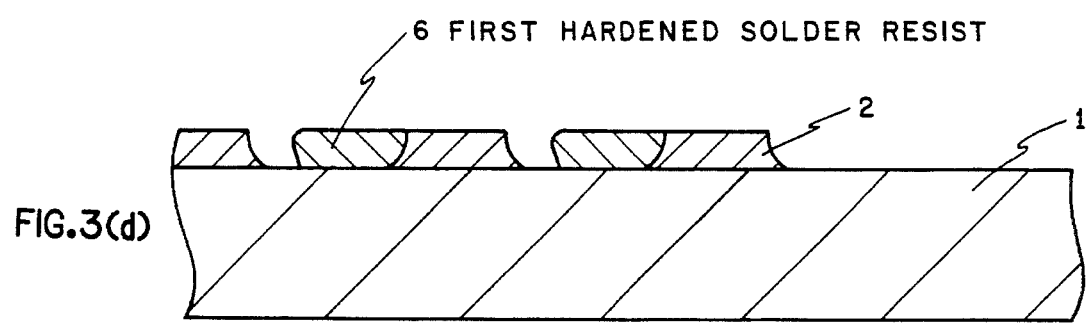
Figure 4A:
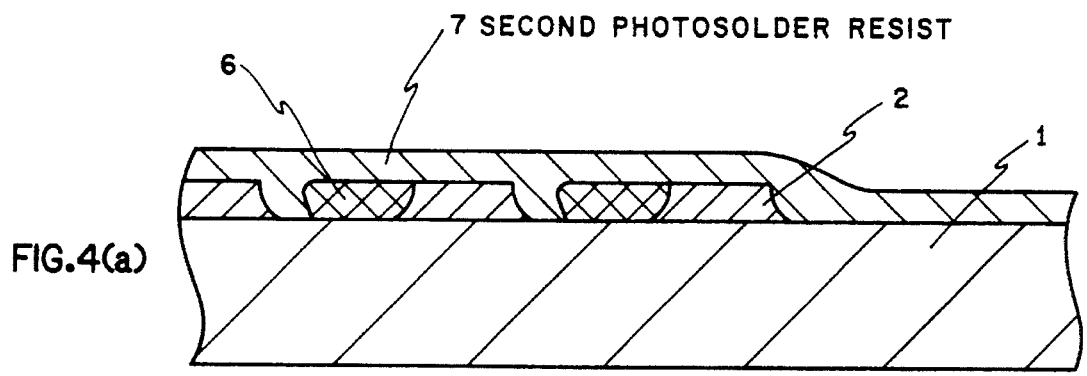
FIGS. 4 (a)–(d) illustrate processes following the processes of FIG. 3.
Figure 4B:
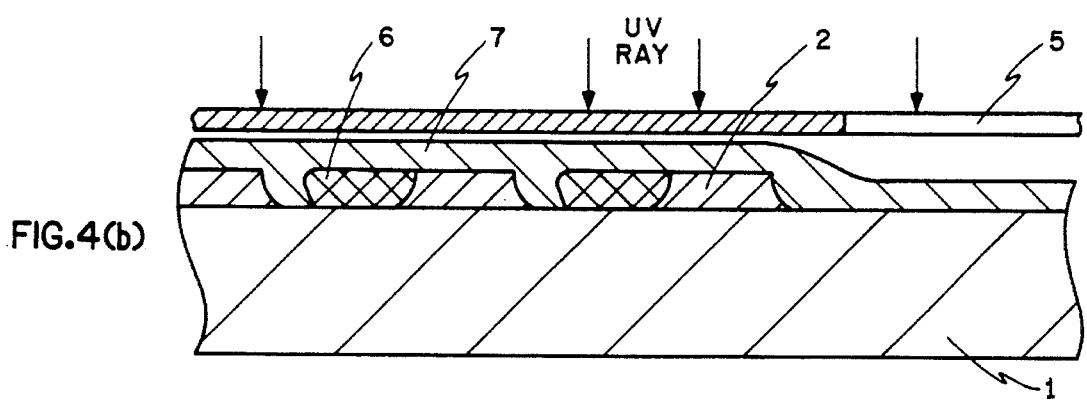
Figure 4C:
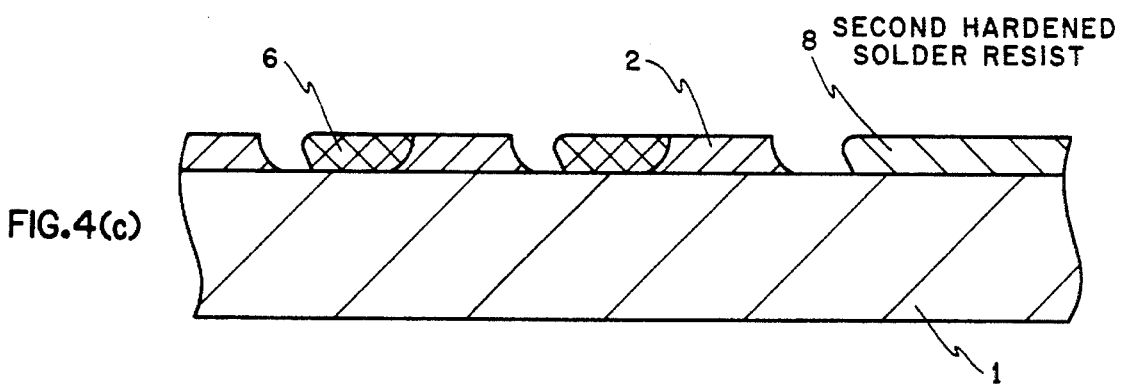
Figure 4D:
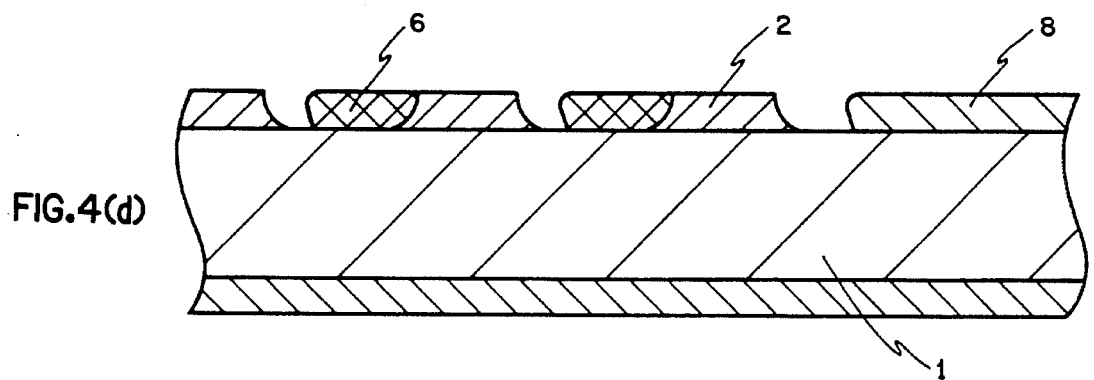

The present invention will now be described with reference to the accompanying drawings. FIGS. 3 (a)–(d) and FIGS. 4 (a)–(d) are longitudinal cross-sectional views illustrating the manufacturing processes of a printed wiring board according to a first embodiment of the present invention. After pads 2 for mounting parts are formed on an insulating board 1 at desired positions for a circuit forming process using etching resist 3 as shown in FIG. 3 (a), first photosolder resist 4 is applied to the pads and the peripheral areas of the pads 2 without peeling off etching resist 3 (FIG. 3 (b)). Ethylene chloride, or any similar resist that allows the use of solvent capable of separating the etching resist 3 as a developing liquid, may be used as the first photosolder resist 4. Next, after said resist dries to a tack-free state, interspaces between the pads 2 are exposed to ultraviolet rays via Mylar film 5 to develop the resist with the aid of the above-mentioned developing liquid, following which the etching resist 3 is peeled off to leave behind the hardened first solder resist 6 between the pads 2 (FIG. 3 (d)).

Next, second photosolder resist 7 is applied to the entire surface on one side of the insulating board 1 (FIG. 4 (a)). After said resist 7 dries to a tack-free state, second hardened solder resist 8 is formed on desired areas excluding the areas of the first hardened solder resist 6 formed in the preceding process by processing the resist 7 according to the same exposure process (FIG. 4 (b)) and the developing process (FIG. 4 (c)) as described above. Thereafter, the processes illustrated in FIGS. 4(a)–(d) are applied repeatedly to the other side of the board 1 to obtain a printed wiring board (FIG. 4(d)) according to the manufacturing method of the first embodiment of the invention.

Figure 5A:
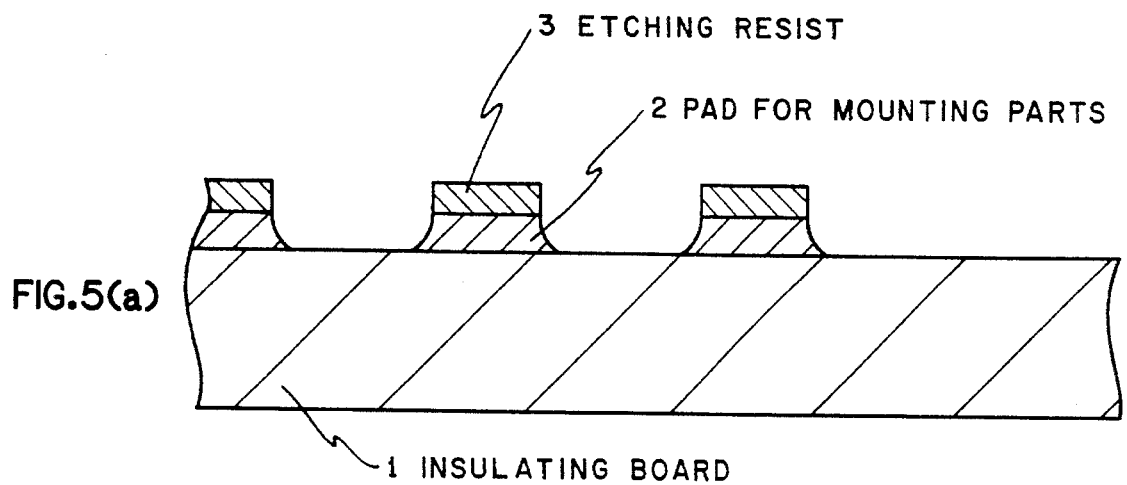
FIG. 5 is a longitudinal cross-sectional view illustrating the method of manufacturing the printed wiring board according to a second embodiment of the present invention.
Figure 5B:
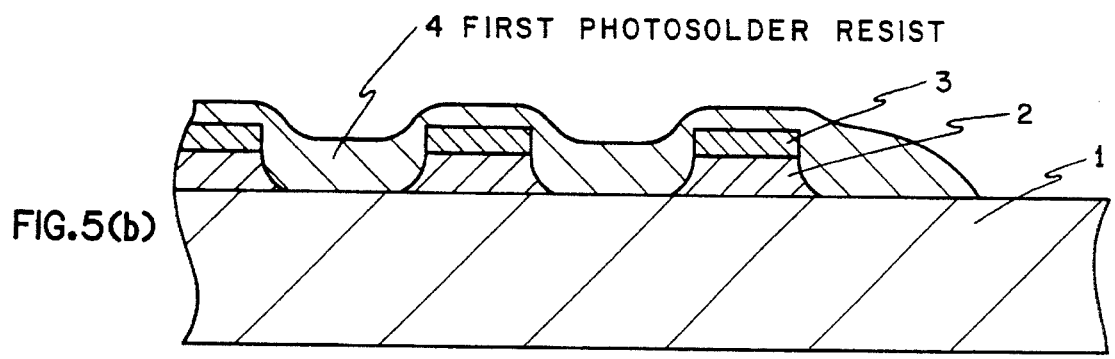
Figure 5C:
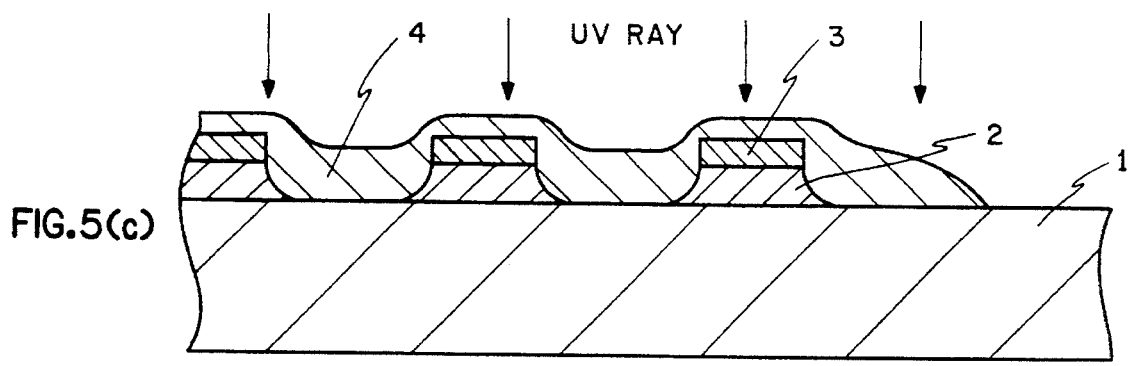
Figure 5D:
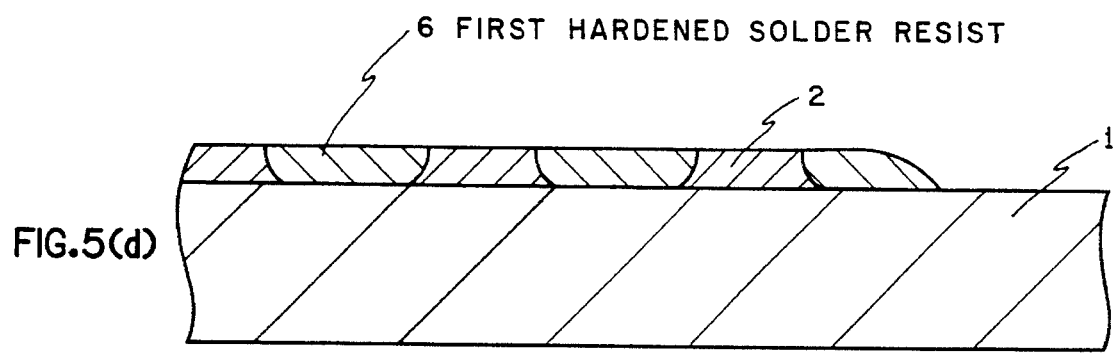

FIGS. 5 (a)–(d) and FIGS. 6 (a)–(d) are longitudinal cross-sectional views illustrating the manufacturing processes of the printed wiring board according to a second embodiment of the present invention. After pads 2 for mounting parts are formed at desired positions on an insulating board 1 in the circuit-forming process using etching resist as illustrated in FIG. 5 (*a*), a first photosolder resist 4 is applied to the entire surface on one side of the insulating board 1 without peeling off etching resist 3 (FIG. 5 (*b*)). Next, after the resist 4 dries to a tack-free state, it is fully exposed to light as illustrated in FIG. 5 (*c*). Using the developing liquid employed in the first embodiment, the resist 4 is chemically and physically developed, following which the etching resist is ground off by brush. Next, second photosolder resist 7 is applied to the entire surface of the insulating board 1 excluding the circuit pattern but including the interspaces between the pads 2 (FIG. 6 (*a*)). After the resist 7 has dried to a tack-free state, second hardened solder resist 8 is formed on desired areas excluding the pads 2 by processing the resist 7 according to the above-described exposure process (FIG. 6 (*b*)) and developing process (FIG. 6 (*c*)). Thereafter, the processes illustrated in FIGS. 6 (*a*)–(*d*) are also applied to the other side of the insulating board 1 to obtain a printed wiring board (FIG. 6 (*d*)) according to the second embodiment of the present invention.

As described above, according to the present invention, in the solder resist process employed in manufacturing a printed wiring board, after a desired conductor pattern is formed in the above described circuit forming process using etching resist, the photosolder resist is formed in accordance with a known method in which the etching resist is not peeled off. Therefore, even if the solder resist adheres to the pads due to misalignment of the Mylar film and the insulating board in the exposure process, since the etching resist is already present on the pads, the solder resist that attaches to the pads in the developing process can be peeled off together with the etching resist, with the result that the standards regarding the effective pad width necessary for maintaining contact reliability between parts and the pads are satisfied.

It is to be understood that variations and modifications of the method disclosed herein will be evident to those skilled in the art. It is intended that all such modifications and variations be included within the scope of the appended claims.

What is claimed is:

1. A method of manufacturing a printed wiring board comprising the processes of:

forming pads for mounting parts on an insulating board in a circuit-forming process using etching resist and thereafter leaving said etching resist formed on the pad as it is without peeling it off, applying a first photosolder resist onto particular areas including at least the interspaces between the pads formed on said insulating board, and exposing the interspaces between the pads to light and then peeling off said etching resist together with the first photosolder resist, which has not yet completely hardened despite subjection to a developing process and exposure to light for hardening said first photosolder resist.

2. A method of manufacturing a printed wiring board as claimed in claim 1 wherein after said first photosolder resist is fully exposed to light and said resist is developed, its upper surface portion is ground and removed together with said etching resist to form a first hardened photosolder resist at least over the interspaces between the pads for mounting parts.

3. A method of manufacturing a printed wiring board as claimed in claim 1 wherein a second photosolder resist is applied to the insulating board on which said first hardened photosolder resist has been formed to form a second hardened photosolder resist on desired areas excluding the interspaces between said pads.

4. A method of manufacturing a printed wiring board as claimed in claim 1 wherein said first and second hardened photosolder resists are formed on the opposite side of the insulating board having said pads thereon.

\* \* \* \* \*